United States Patent [19]
Cheung et al.

[11] Patent Number: 6,071,795
[45] Date of Patent: Jun. 6, 2000

[54] SEPARATION OF THIN FILMS FROM TRANSPARENT SUBSTRATES BY SELECTIVE OPTICAL PROCESSING

[75] Inventors: Nathan W. Cheung, Albany; Timothy D. Sands, Moraga; William S. Wong, Berkeley, all of Calif.

[73] Assignee: The Regents of the University of California, Oakland, Calif.

[21] Appl. No.: 09/012,829

[22] Filed: Jan. 23, 1998

[51] Int. Cl.[7] .................................................. H01L 21/302
[52] U.S. Cl. ..................... 438/458; 438/483; 438/796; 438/22
[58] Field of Search ................. 438/977, 22, 46, 438/33, 455, 458, 459, 795, 796, 798, 478, 464, 479, 483, 460; 216/62, 65

[56] References Cited

U.S. PATENT DOCUMENTS

| | | | |
|---|---|---|---|
| 4,448,636 | 5/1984 | Baber | 438/670 |
| 4,774,194 | 9/1988 | Hokuyou et al. | 438/977 |
| 4,883,561 | 11/1989 | Gmitter et al. | 156/249 |
| 5,374,564 | 12/1994 | Bruel | 438/455 |
| 5,376,580 | 12/1994 | Kish et al. | 438/455 |
| 5,413,951 | 5/1995 | Ohori elt al. | 428/459 |
| 5,559,043 | 9/1996 | Bruel | 438/977 |
| 5,836,325 | 11/1998 | Motoki et al. | 438/796 |
| 5,837,561 | 11/1998 | Kish, Jr. et al. | 438/47 |

OTHER PUBLICATIONS

Bohandy et al., "Metal deposition from a supported metal film using an excimer laser," *Journal of Applied Physics*, vol. 60, No. 4, Aug. 1986, pp. 1538, 1539.

Sameshima, "Laser beam application to thin film transistors," *Applied Surface Science*, vol. 96–98, 1996, pp. 352–358.

Kelly, et al. "Optical patterning of GaN films" *Applied Physics Letters*, vol. 69 (12), Sep. 16, 1996, pp. 1746–1751.

Kelly et al. "Optical process for liftoff of group III–nitride films", *Physica Status Solidi* (a) vol. 159, 1997, pp. R3–R4.

Fastenau, et al., "Epitaxial Lift–Off of Thin InAs Layers" *Journal of Elect. Mat.* vol. 24, No. 6, 1995, pp. 757–760.

Nakamura, et al., "GaN Growth Using GaN Buffer Layer" *Japanese journal of Applied Physics*, vol. 30, 1991,pp. L1705–L1707.

Ruby et al., "Micromachined Cellular Filters" IEEE MTT–S Digest 1996, pp. 1149–1152.

Ruby et al., "Micromachined Thin Film Bulk Acoustic Resonators" IEEE 1994 pp. 135–138.

Yablonovitch, et al., "Extreme selectivity in the lift–off of epitaxial GaAs films," Applied Physics Letters, vol. 51, no. 26, 1987, pp. 2222–2224.

Yablonovitch, et al., "Van der Waals bonding of GaAs on Pd Leads to a permanent, solid–phase–topotaxial, metallurgical bond," *Applied Physics Letters*, vol. 59, no. 24, 1991, pp. 3159–3161.

Detchprohm, et al., in "The growth of thick GaN film on sapphire substrate by using ZnO buffer layer," *Journal of Crystal Growth*, vol. 128, Nos. 1–4, 1993, pp. 384–390.

Wong, et al., "Pulsed excimer laser processing of A1N/GaN thin films," *Materials Research Society Symposium Proceedings*, vol. 449, 1997, pp. 1011–1016.

(List continued on next page.)

*Primary Examiner*—Sanitri Mulpuri
*Attorney, Agent, or Firm*—Pennie & Edmonds LLP

[57] ABSTRACT

A method of separating a thin film of GaN epitaxially grown on a sapphire substrate. The thin film is bonded to an acceptor substrate, and the sapphire substrate is laser irradiated with a scanned beam at a wavelength at which sapphire is transparent but the GaN is strongly absorbing, e.g., 248 nm. After the laser irradiation, the sample is heated above the melting point of gallium, i.e., above 30° C., and the acceptor substrate and attached GaN thin film are removed from the sapphire growth substrate. If the acceptor substrate is flexible, the GaN thin film can be scribed along cleavage planes of the GaN, and, when the flexible substrate is bent, the GaN film cleaves on those planes. Thereby, GaN lasers and other electronic and opto-electronic devices can be formed.

25 Claims, 5 Drawing Sheets

OTHER PUBLICATIONS

Nakamura "First III–V–nitride–based violet laser diodes," *Journal of Crystal Growth,* vol. 170, 1997, pp. 11–15.

Nakamura, et al., "Novel metalorganic chemical vapor deposition system for GaN growth," *Applied Physics Letters,* vol. 58, No. 18, 1991, pp. 2021–2023.

Sink, et al., "Cleaved GaN facets by wafer fusion of GaN to InP," *Applied Physics Letters,* vol. 68, No. 15, 1996.

Kelly et al. "Laser–processing for patterned and free–standing nitride films" Research Society Symposium Proceedings, vol. 482, 1998, pp. 973–978.

6,071,795

SEPARATION OF THIN FILMS FROM TRANSPARENT SUBSTRATES BY SELECTIVE OPTICAL PROCESSING

GOVERNMENT INTEREST

This invention was made with Government support under Contract No. FDF49620-97-1-0431-05/00, awarded by the Joint Services Electronics Program. The Government has certain rights in this invention.

FIELD OF THE INVENTION

The invention relates generally to the formation of thin films. In particular, the invention relates to transferring a thin film from its growth substrate to another substrate.

BACKGROUND ART

Compound semiconductors, such as the III–V semiconductors, are known to offer superior performance in some special applications, for example, for high-speed and high-temperature electronics and for optical emitters and detectors in particular optical wavelength bands. For efficient semiconductor operation, it is generally required that the semiconductor be crystalline, that is, have a regular atomic arrangement. The technologies for the growth of singly crystalline large-scale bodies have been greatly advanced for silicon (Si), to a reduced extent for gallium arsenide (GaAs), and to a yet lesser extent for indium phosphide (InP). For other compound semiconductors, such as GaN, bulk crystalline substrates are not readily available. Sometimes, the unavailability results from an immaturity in the technology. However, bulk crystalline GaN substrates are intrinsically very difficult to grow because of the high vapor pressure of nitrogen above molten GaN. For these materials, the usual practicable procedure involves epitaxially growing the compound semiconductor upon a crystalline substrate of another material that is more easily formed into a crystalline substrate, that is, heteroepitaxy.

Gallium nitride (GaN) is a very interesting III–V semiconductor having a bandgap corresponding to the required bandgap for blue lasers and other optical devices emitting in the blue region of the spectrum. Semiconductor optical emitters in the red, yellow, and even green portions of the spectrum are known, but blue emitters are not widely available but are greatly desired both for their very short emission wavelength, enabling a dense, data recording or reading, and also for the completion of a three-color optical spectrum, thus enabling a full multicolor display. An active device based upon GaN needs to be epitaxially grown upon a substrate, but singly crystalline substrates of GaN or other equally difficult compound substrates are not readily available. The alloy system (Al, In, Ga)N provides bandgap control over the entire visible spectrum.

In the case of gallium nitride, it has been discovered that GaN thin films can be grown on substrates of sapphire, which is a form of $Al_2O_3$. A plane of the hexagonal crystal structure of GaN is closely matched to a crystallographic plane of sapphire. Foreign growth substrates are known for other compound semiconductors. High-quality sapphire substrates of up to 150 mm diameter are available at high but reasonable prices. Once the GaN thin film has been epitaxially formed over the sapphire substrate, it may be processed into electronic and opto-electronic devices based upon the semiconductive properties of GaN. However, this fabricational approach does not produce the commercially best devices. In the case of GaN, the sapphire growth substrate introduces difficulties in the fabrication process. For example, sapphire cleaves in a basal plane which is perpendicular to the direction in which GaN epitaxially grows on sapphire. As a result, the GaN/sapphire composite cannot be as easily diced as silicon. The lack of good cleavage with GaN on sapphire is particularly a problem with GaN edge-emitting laser requiring a highly reflective (i.e., smooth) end face, typically provided in other materials by a cleaved face. Reactive ion etching has been used to for etching vertical reflector walls, but control of verticality is a problem. Sink et al. have disclosed an alternative process in "Cleaved GaN facets by wafer fusion of GaN to InP," *Applied Physics Letters*, vol. 68, no. 15, 1996. However, this process requires abrading away most of the entire sapphire substrate, a tedious task and one prone to harm the adjacent GaN thin film.

The processes described above do not address the need for a GaN opto-electronic chip to be integrated with an electronic semiconductor chip, most particularly, of silicon.

For these reasons, a number of technologies have been developed to detach thin films of compound semiconductors from their growth substrates and to reattach them to other substrates, whether they be of silicon, other semiconductors, or non-semiconductive materials.

Yablonovitch originated the technology of transferring GaAs-based thin films from a GaAs growth substrate to a silicon substrate. The process is described by Yablonovitch et al. in "Extreme selectivity in the lift-off of epitaxial GaAs films," *Applied Physics Letters*, vol. 51, no. 26, 1987, pp. 2222–2224 and by Fastenau et al. in "Epitaxial lift-off of thin InAs layers, *Journal of Electronic Materials*, vol. 24, no. 6, 1995, pp. 757–760. This same process is described in U.S. Pat. No. 4,883,561 to Gmitter et al. In this process, an epitaxial sacrificial layer is first grown on the substrate, and then the desired film is epitaxially grown on the sacrificial layer. The as-grown film is separated from its growth substrate by selectively etching away the sacrificial layer with a liquid etchant which attacks neither the substrate nor the GaAs thin film, thereby lifting off a free-standing film. The free-standing film can then be bonded to a substrate of silicon or other material by one of a variety of methods, as has been described by Yablonovitch et al. in "Van der Waals bonding of GaAs on Pd leads to a permanent, solid-phase-topotaxial, metallurgical bond," *Applied Physics Letters*, vol. 59, no. 24, 1991, pp. 3159–3161. The so bonded GaAs thin film can then be further processed to form devices or circuits that integrate the functionalities of GaAs and of the substrate material. Quantum wells and other advanced structures can be grown on the GaAs thin film prior to liftoff. Similar results of bonding InAs thin films onto GaAs substrates have been reported by Fastenau et al., ibid.

These prior-art processes have not addressed the important compound GaN as well as other non-GaAs compound semiconductors. Further, the prior-art processes rely upon a liquid etchant dissolving from the sides a very thin sacrificial layer between the growth substrate and the epitaxially formed film. Such a separation process is geometrically disadvantageous and results in separation times that are commercially uneconomic for large-area films.

Kelly et al. have reported an alternative separation process for GaN films in "Optical process for liftoff of group III-nitride films," *Physica Status Solidi* (a), vol. 159, 1997, pp. R3, R4. In this process, a GaN film is epitaxially grown on a sapphire substrate. The resultant structure is then irradiated from the sapphire side with an intense laser beam at a wavelength of 355 nm. This wavelength is within the sapphire bandgap so that the radiation passes through it, but the irradiation wavelength is somewhat outside of the absorption edge of GaN. As a result, a significant portion of the laser energy is absorbed in the GaN next to the interface. The intense heating of the GaN separates the gallium from gaseous nitrogen, thereby separating the GaN thin film from the sapphire substrate. It is known that GaN undergoes incongruent decomposition at temperatures above about 800° C.

The process of Kelly et al., however, suffers difficulties. We observe that the 355 nm radiation of Kelly et al. has sufficient power that the overlying GaN film is explosively blown away during the laser irradiation, and fracturing of the film often occurs. Obviously, such an explosive process does not dependably produce uniform films. Even if the explosive process is acceptable, the area of the high-energy laser beams required for this process is limited. The beam of Kelly et al. has a diameter of 7 mm. If 7 mm portions are being separated, then it is impossible to obtain film fragments of larger size. It is greatly desired to obtain larger film segments by a process that is not so violent.

SUMMARY OF THE INVENTION

The invention may be summarized as a method of transferring a crystalline film from a growth substrate to an acceptor substrate. The film of one composition is grown on a substrate of another composition having an absorption edge at a shorter wavelength than that of the grown film. The film side of the structure is then bonded to an acceptor substrate. A strong optical beam irradiates the side of the structure having the growth substrate with radiation that passes through the growth substrate but which is strongly absorbed in the film, thereby weakening the interfacial bond due to localized decomposition of the film at the interface. The intensity of the radiation is, however, low enough to not cause the irradiated area to separate. Preferably, the laser is raster scanned over an area larger than that of the laser beam. A separation process is performed after the completion of the laser irradiation. In the example of a GaN thin film, the separation process may include heating the structure to above the melting point of gallium, which is 30° C. Chemical separation processes may also be used.

Alternatively, a sacrificial layer may be grown between the desired film and the growth substrate. The optical beam absorbed by the sacrificial layer can then irradiate from the side of either the growth or acceptor substrate that is transparent to the optical beam.

The acceptor substrate may be flexible, for example, an elastomeric substrate. In this case, the film may be laser scribed along cleavage planes, and then the flexible substrate is bent to cleave the film at desired facets.

DETAILED DESCRIPTION OF THE PREFERRED EMBODIMENTS

Figure 1:
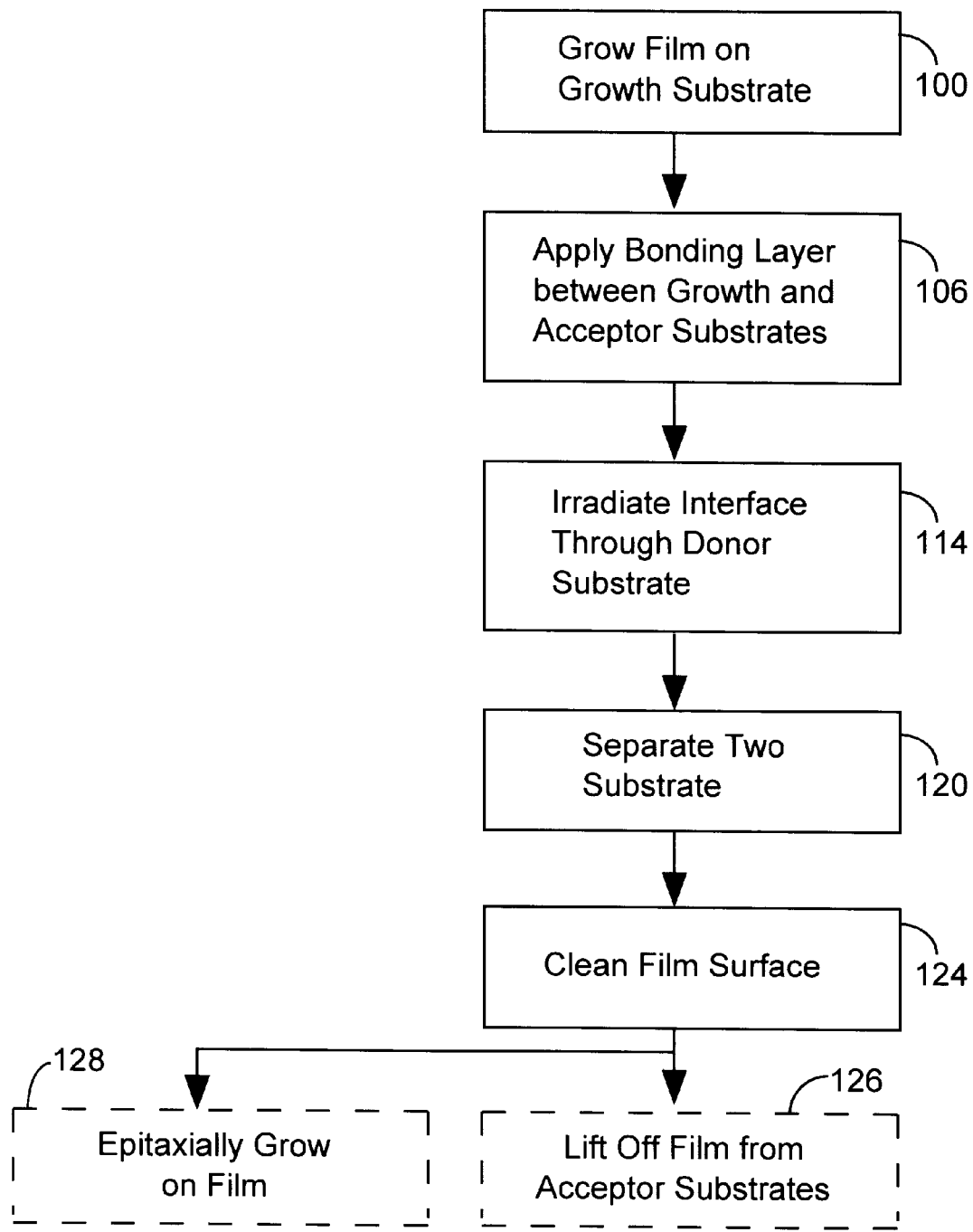
FIG. 1 is a flow diagram of the practice of one embodiment of the invention.
Figure 2:
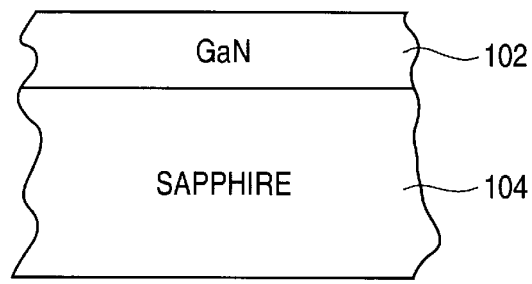
FIGS. 2 through 6 are cross-sectional views of structures produced during the process of FIG. 1.

One embodiment of the invention follows the process flow diagram of FIG. 1. In step 100, a thin film 102, illustrated in the structural cross section of FIG. 2, is grown on a donor substrate 104. In a specific embodiment, the thin film 102 is composed of gallium nitride (GaN) to a thickness of 3 $\mu$m, and the donor substrate 104 is composed of crystalline sapphire. It is known that this combination enables the growth strongly crystalline GaN, as has been described by Nakamura in "GaN growth using GaN buffer layer," *Japanese Journal of Applied Physics*, vol. 30, 1991, pp. L1705–L1707 and by Nakamura et al. in "Novel metalorganic chemical vapor deposition system for GaN growth," *Applied Physics Letters*, vol. 58, no. 18, 1991, pp. 2021–2023. See also the disclosure by Detchprohm et al. in "The growth of thick GaN film on sapphire substrate by using ZnO buffer layer," *Journal of Crystal Growth*, vol. 128, nos. 1–4, 1993, pp. 384–390. The composite structure of GaN on sapphire is available from CREE Research Inc. of Durham, North Carolina having the GaN deposited on a polished side of the sapphire. Because of the later laser processing, the backside of the sapphire should also be polished, for example, with 0.5 $\mu$m diamond paper or diamond-containing slurry.

Figure 3:
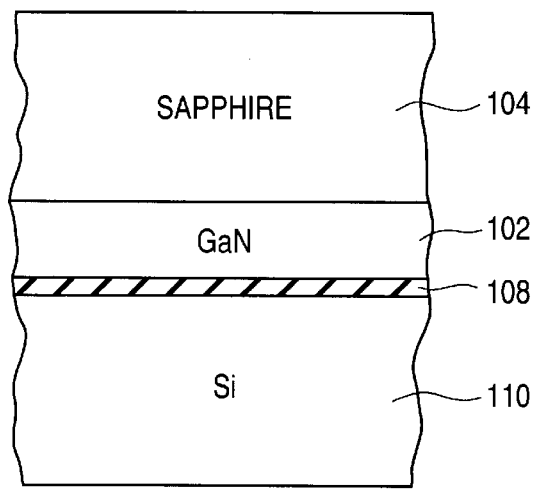

In step 106, a bonding layer 108, as illustrated in the structural cross section of FIG. 3, is applied either on top of the thin film 102 or on an acceptor substrate 110, and in step 112 the donor substrate 104 is joined to the acceptor substrate 110 to form a bonded composite structure illustrated in FIG. 2. It is possible to rely upon van der Waals bonding between crystalline materials in place of a distinct bonding material, as is described by Sink et al. in the previously cited article and by Bhat et al. in U.S. Pat. No. 5,207,864. Such a bonding is sometimes explained in terms of atomic rearrangement and may be generically described as fusing together two dissimilar materials.

In the specific embodiment, the bonding layer 108 is Double/Bubble, a commercially available 5-minute epoxy, applied to the GaN thin film 102 to a thickness of about 5 $\mu$m. Prior to bonding, the backside of the sapphire is polished using diamond paper. The acceptor substrate 110 is a boron-doped, p-type silicon wafer with a <001> crystalline orientation, and the resulting structure is inverted and pressed against the acceptor substrate 110 consisting of silicon to form the structure of FIG. 3. Spin-on glass (SOG) or Crystalbond can be used in place of Double/Bubble.

Figure 4:
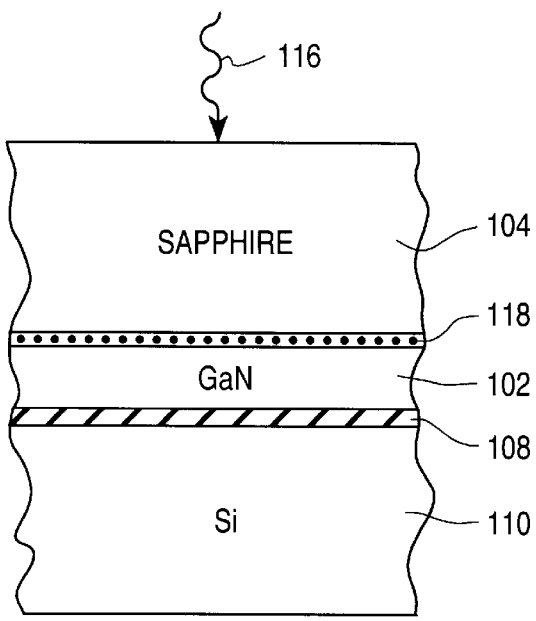

In step 114, as illustrated in FIG. 4, a laser beam 116 irradiates the composite structure, preferably from the side of the donor substrate 104 with radiation that passes through the donor substrate 104 but which is strongly absorbed by the thin film 102 in a separation region 118 of the thin film 108.

In the specific embodiment, the laser radiation incident upon the sapphire donor substrate 104 may be 248 nm radiation from a KrF pulsed excimer laser having a pulse width of 38 ns. This radiation easily passes through the sapphire donor substrate 104 but is strongly absorbed by the GaN thin film 102 in a separation region 118. In this irradiation step 114, a relatively small laser beam preferably rasters the area of the film segment to be separated. The actual irradiation does not separate the film from its substrate. Because the irradiation process affects only the buried interface, the irradiation can be performed in either vacuum, air, or other ambient.

The energy density of the incident beam in an experimental phase was varied between 100 and 600 mJ/cm$^2$ with the attenuation of the 248 nm radiation in the 0.5 mm thick sapphire estimated to be 20 to 30%. Radiation at 200 mJ/cm² created no visual change. At about 300 mJ/cm² the separation region 118 assumed a metallic silvery color, suggestive of the decomposition of GaN into metallic gallium and gaseous nitrogen. Multiple pulses at 200 mJ/cm² did not detach the films; however, one pulse at 400 mJ/cm² was sufficient for separation, as described below.

Unlike the process of Kelly et al., the energy density at the interface in the above described process is not sufficient to separate the growth substrate from the acceptor substrate. An entire substrate may be laser processed, or a patterned portion may be, prior to the separation.

Wong et al. have disclosed the interaction of 248 nm laser radiation with GaN in "Pulsed excimer laser processing of AlN/GaN thin films," *Materials Research Society Symposium Proceedings,* vol. 449, 1997, pp. 1011–1016. However, this work was directed to annealing and dopant activation of Mg-implanted GaN films, and the irradiation was performed from the film side.

Figure 5:
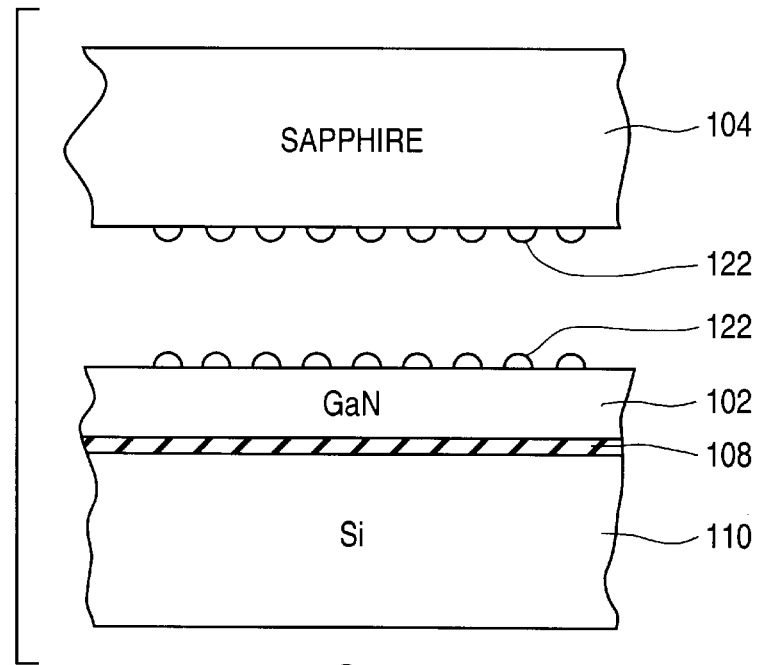

After the laser irradiation creating the separation region 118, a separate process 120 is used to separate the two substrates 104, 110 with the film 102 remaining bonded to the acceptor substrate 110, as illustrated in FIG. 5. A residue 122 from the separation layer 118 may remain on one or both of the substrates. After separation, the growth substrate 104 may be reused, a particular advantage when such substrates are expensive.

In the specific example of a GaN film, simple heating of the entire sample to above the melting point of gallium, that is, above 30° C., melts the gallium in the separation layer 118 without reintegrating the gaseous nitrogen. The residue is believed to be a film of 50 to 100 nm thickness composed of gallium which solidifies when the temperature is reduced to below 30° C.

Figure 6:
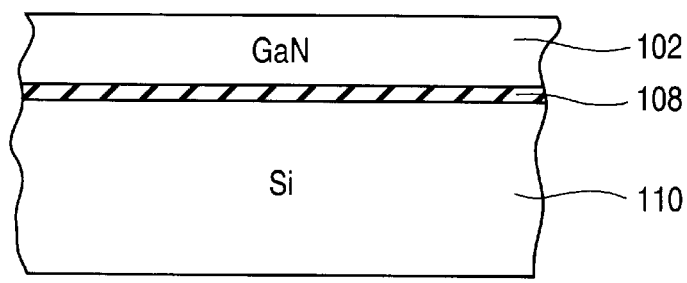

In step 124, the residue is removed to produce the final bonded structure illustrated in FIG. 6. The gallium residual film of the specific example can be removed by a 50:50 volumetric mixture of HCl and $H_2O$, which does not affect the GaN.

It is also possible to use a liquid etchant that is selective to the material of the separation region 118, similarly to the lift-off process taught in the Yablonovitch references.

If desired, in step 126 the thin film 102 is lifted off the acceptor substrate 110 to produce a free-standing thin film 102. If the bonding layer 108 is an organic wax or glue, such as the Crystalbond or spin-on glass, a properly chosen organic solvent, such as acetone, at the proper temperature will dissolve the glue without affecting the film 102. Alternatively, the bonding layer 108 may be metal with a moderate melting point, for example, a solder.

Figure 7:
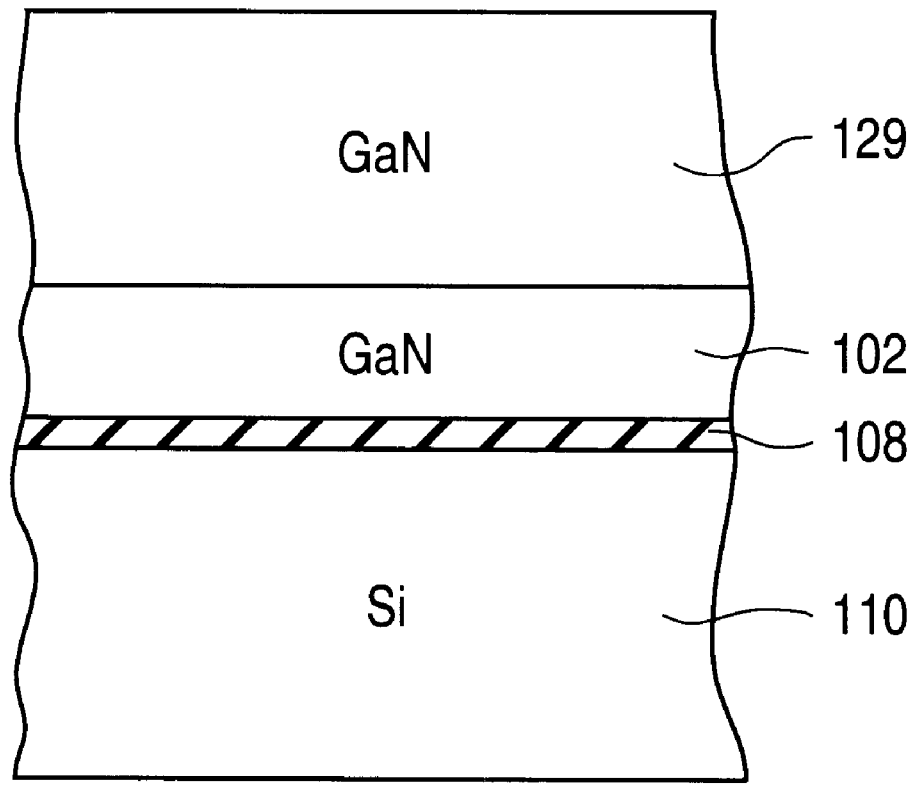
FIG. 7 is a cross-sectional view of an extension of the process of FIGS. 2 through 6.

Alternatively, in step 128 the transferred thin film 102 can be used as a growth substrate for subsequent epitaxial growth. In the case of the very high-quality GaN required for lasers, a GaN film 129, illustrated in the cross-sectional view of FIG. 7 is epitaxially deposited over the top surface of the transferred GaN film 102 after that top surface has been polished and cleaned. A complex laser or other optoelectronic structure can similarly be grown on the transferred film 102. Nakamura describes the fabrication of such a GaN laser in "First III–V-nitride-based violet laser diodes," *Journal of Crystal Growth,* vol. 170, 1997, pp. 11–15.

The above process as detailed in the specific example was used to transfer up to 3 mm×4 mm films of GaN having thicknessesf 2.5 to 3 μm onto 5 mm×5 mm silicon substrates.

X-ray diffraction tests performed on the GaN bonded first to the growth sapphire and then to the silicon substrate showed an unchanged (0002) GaN reflection at about θ32 17.3°0 with respective full-width half-maxima of 0.0976° and 0.0977°. That is, the crystallinity of the GaN was not affected by the transfer.

It is not necessary to use a laser as the light source as long as the light intensity is sufficient to form the separation layer 18. For example, UV light of sufficient intensity may be used to convert GaN to metallic gallium and included nitrogen bubbles.

Figure 8:
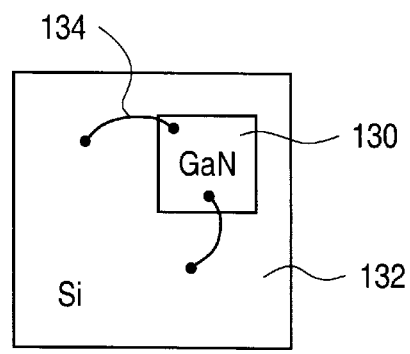
FIG. 8 is a plan view of an opto-electronic GaN thin film integrated onto a silicon substrate providing electronic functions.

The above example used silicon as the acceptor substrate. The combination, as illustrated in the plan view of FIG. 8, of a smaller GaN film 130 and a larger silicon substrate 132 to which the GaN is bonded is particularly advantageous. The combination allows the integration of optical components, such as the GaN laser of Nakamura, in the GaN and electronic integrated circuitry in the silicon. Bonding wires 134 or other electrical lines interconnect the two portions. Similarly, a GaAs acceptor substrate may be used with GaN. AlInGaP can be epitaxially grown on the GaAs, and the combination of the different materials allows for the fabrication of arrays of microscopic red, green, and blue light emitter diodes on a single GaAs substrate for color display applications.

The use of silicon, GaAs, InP, and other crystalline materials as the acceptor substrate is further advantageous if the {1,-1,0,0} cleavage plane of the GaN film is crystallographically aligned with a cleavage plane of the acceptor substrate. The structure of the GaN film and the aligned acceptor substrate can then be readily cleaved.

Other types of acceptor substrates may be used. For example, glass or other ceramics may be used. Indium tin oxide (ITO) is known to bond well with these materials, and thus may be used as the bonding layer. Wax such as Apiezon or Crystalbond be used as a temporary acceptor substrate which also acts as the bonding layer.

One alternative acceptor substrate is an elastomeric or other mechanically compliant substrate. An example of an elastomeric film is GelPak, available from Vichem Corporation of Sunnyvale, Calif. Metal foil can also be used. A compliant substrate is particularly interesting for films of GaN and other laser materials. As illustrated in plan view in FIG. 9, a GaN film 130 is bonded to a compliant acceptor substrate 140. Reactive ion etching (RIE) or milling is used to emboss in the GaN film a series of perforations 142 running parallel to the desired {0,1,-1,0} cleavage planes for GaN, and a series of dense or continuous notches 144 running perpendicularly along the {2,-1,-1,0} planes in the regions where cleaved facets are desired. It is not necessary to etch the notches 144 completely through the film 130, but only enough to initiate the separation of the film 130 in the plane perpendicular to the notches 144 and the plane of the film 130. The notches 144 will delineate the laser dimension perpendicular to the laser facets.

Figure 9:
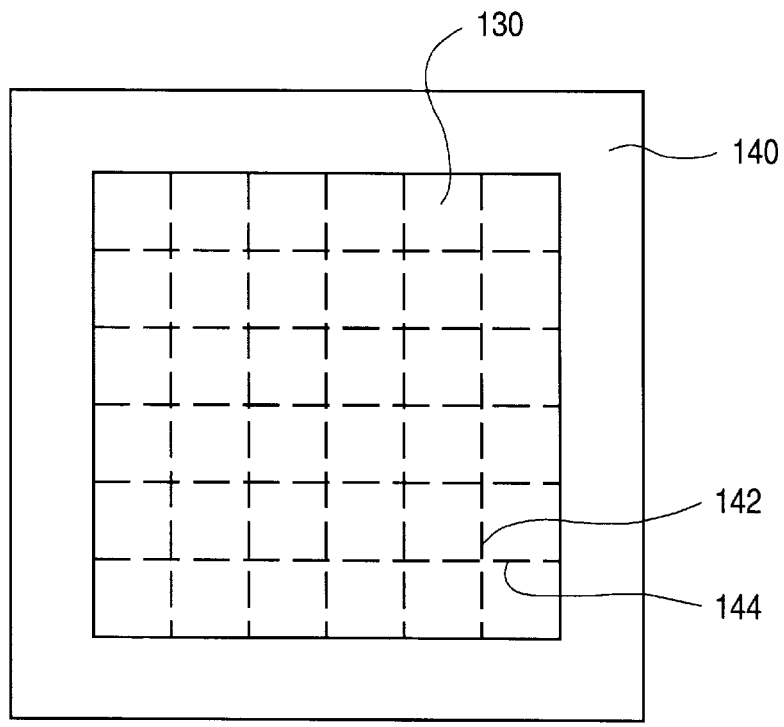
FIG. 9 is a plan view of a GaN thin film attached to a flexible substrate and scored for dicing.
Figure 10:
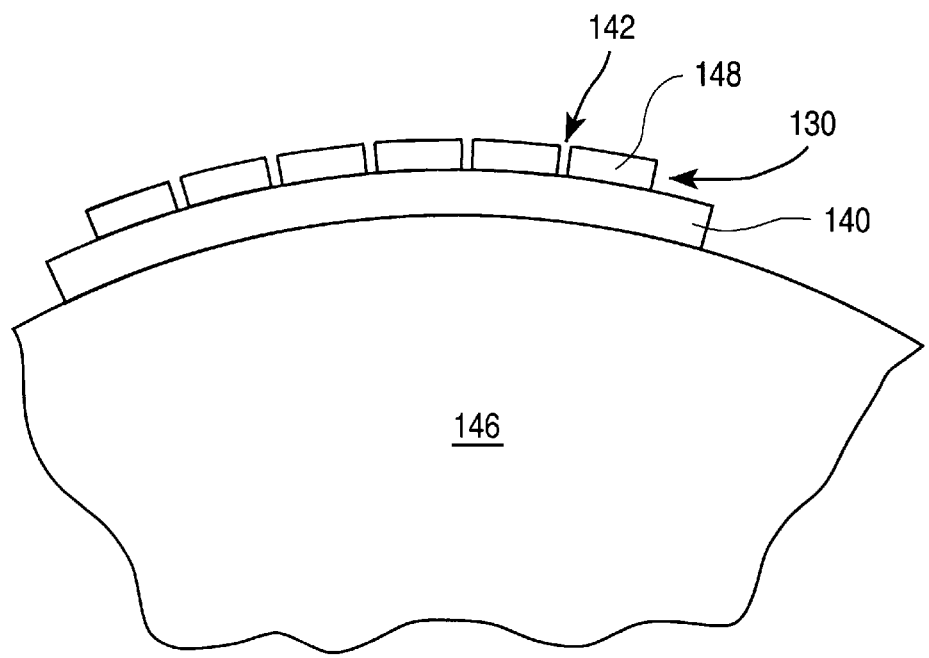
FIG. 10 is a cross-sectional view of the structure of FIG. 9 bent on a mandrel to cleave the GaN thin film.

The structure of FIG. 9 is then bent about an axis defined by the intersection of the cleavage plane with the film surface. For example, the structure is conformed to the thick end of a tapered cylindrical mandrel 146 illustrated in axial cross section in FIG. 10, with the direction of the cleaving perforations 142 aligned along the axis of the mandrel 146. The compliant substrate 140 is then slid along the axis to yet smaller mandrel radii until the increased curvature induces the GaN to cleave into axial segments 148 with cleanly cleaved facets along the perforations 142.

The invention is not limited to GaN, but may be used with other materials exhibiting incongruent decomposition at elevated temperatures. As mentioned above, the (Al, In, Ga)N alloy family provides tunable bandgaps, advantageous for optical devices. All three of the III–V compounds of the alloy, that is, AlN, InN, and GaN exhibit incongruent decomposition as manifested by their release of nitrogen gas as the temperature is raised. The II–VI semiconductor ZnO also incongruently decomposes. These semiconductors are characterized by their anion forming an elemental gas.

However, AlN, with a bandgap of 6.2 eV, is transparent to 248 nm radiation. Hence, an AlN film grown on a sapphire substrate with an intermediate sacrificial GaN layer can be separated by irradiating the GaN layer from the side of either the film or the substrate. Separated AlN films of high crystalline quality, such as could be achieved using this process, can be integrated with silicon electronics to fabricate tunable piezoelectric microresonators for gigahertz communication devices. Such devices are currently fabricated utilizing poor-quality AlN films sputtered directly onto silicon at low temperatures so as to avoid undesirable reactions. The technology for microresonators is described by Ruby in "Micromachined cellular filters," *IEEE MTT-S Digest, International Microwave Symposium,* IEEE Publication 0-7803-3246-6/96, 1996, pp 1149–1152 and by Ruby et al. in "Micro machined thin film bulk acoustic resonators," *Proceeding of the 1994 IEEE International Frequency Control Symposium,* IEEE Publication 0-7803-1945-1/94, 1994, pp. 135–138.

Another example of a material that incongruently decomposes is lead zirconium titanate (PZT) and associated materials, such as lead lanthanum zirconium titanate, and lead niobium titanate. These perovskite oxide materials exhibit a variety of behavior, such as being ferroelectric, piezoelectric, etc., and are being developed for sensor, actuator, and memory applications. It is advantageous for some applications that these perovskite materials be in crystallographically oriented forms. It is known that PZT loses PbO at about 600 to 650° C. Thus, in another use of the invention a film of PZT or related material is grown on a sapphire growth substrate. Then, the growth substrate and PZT film are bonded to an acceptor substrate, and laser irradiation from the side of the growth substrate forms a mechanically weak decomposed separation layer at the PZT/substrate. The included PbO greatly weakens the bonding, allowing the film to be peeled from the substrate.

Although the above embodiments have been described with the use of laser irradiation, any sufficiently strong optical radiation can be used to form the separation layer.

The invention thus provides a useful and simple method of transferring crystalline thin films from a growth substrate to an acceptor substrate. It is particularly useful with materials such as GaN which require heteroepitaxy on substrates that are expensive and difficult to process.

What is claimed is:

1. A method of separating a thin film from a growth substrate, comprising the steps of:
    growing a film of a first composition on a first side of a crystallographically oriented first substrate of a second composition, wherein said film comprises a III–V nitride compound and said first substrate comprises sapphire;
    bonding said film on a side thereof opposite said first substrate to a second substrate;
    irradiating said first substrate from an irradiation side thereof with light of a wavelength that is substantially more strongly absorbed in said film than in the one of said first and second substrates on said irradiation side of said film, wherein said irradiating step forms an interfacial layer between said film and said first substrate; and
    after completion of said irradiating step, detaching said second substrate with portions of said film attached thereto from said first substrate, wherein said detaching step severs said interfacial layer.

2. The method of claim 1, wherein said irradiation side is a second side of said first.

3. The method of claim 1, wherein said detaching step liquifies said interfacial layer.

4. The method of claim 1, wherein said detaching step ultrasonically irradiates said first and second substrates so as to dissolve said interfacial layer.

5. The method of claim 1, wherein said detaching step selectively etches away said interfacial layer.

6. The method of claim 1, wherein said irradiating step raster scans a laser beam over an area of said first substrate.

7. The method of claim 1, wherein said irradiating step uses a KrF excimer laser.

8. The method of claim 1, wherein said III–V nitride compound comprises gallium and nitrogen.

9. The method of claim 8, wherein said detaching step includes heating said first and second substrates and said film to a temperature above a melting point of gallium.

10. The method of claim 9, wherein said irradiating step is performed at a temperature below said melting point.

11. The method of claim 1, wherein said III–V nitride compound comprises aluminum and nitrogen.

12. The method of claim 1, wherein said second substrate comprises a wax.

13. The method of claim 1, wherein said second substrate comprises a silicon substrate.

14. The method of claim 1, wherein said second substrate comprises a ceramic.

15. The method of claim 1, wherein said second substrate comprises a perovskite.

16. The method of claim 1, wherein said substrate comprises a flexible substrate.

17. The method of claim 16, further comprising:
    etching scribe lines in said thin film along cleavage planes of said thin film; and
    bending said flexible substrate in a direction perpendicular to said scribe lines sufficiently to cleave said thin film.

18. The method of claim 17, wherein said thin film comprises gallium and nitrogen.

19. The method of claim 1, wherein said bonding step includes applying a glue layer between said film and said second substrate.

20. The method of claim 1, wherein said bonding step includes applying a metal layer between said film and said second substrate.

21. The method of claim 1, wherein said bonding step includes fusing said film to said second substrate.

22. The method of claim 1, comprising the further step of lifting off said thin film from said second substrate to form a free-standing thin film.

23. The method of claim 1, further comprising epitaxially growing another film on said thin film bonded to said second substrate.

24. A method of separating a thin film from a growth substrate, comprising the steps of:
    growing a film of a first composition on a first side of a crystallographically oriented first substrate of a second composition, wherein said film comprises GaN;
    bonding said film on a side thereof opposite said first substrate to a second substrate;

irradiating said first substrate from a second side thereof with light of a wavelength that is substantially more strongly absorbed in said film than in said first substrate, said irradiating step producing an interfacial layer between said first substrate and said film and not causing said second substrate to separate from said first substrate; and after completion of said irradiating step, detaching said second substrate with portions of said film attached thereto from said first substrate.

25. The method of claim 24, wherein said detaching step includes heating said first and second substrates to above a melting point of gallium.

* * * * *